(12) United States Patent
Anderson et al.

(10) Patent No.: US 7,507,506 B1
(45) Date of Patent: Mar. 24, 2009

(54) METHOD AND STRUCTURE FOR CREATING A MULTILAYER MASK (MLM OR MLR) USING MULTIPLE WRITE TOOLS TO MINIMIZE MASK WRITE AND SUBSTRATE COSTS

(75) Inventors: Brent A. Anderson, Jericho, VT (US); Jed Hickory Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/164,421

(22) Filed: Jun. 30, 2008

(51) Int. Cl.
*G03F 1/00* (2006.01)
*G03C 5/00* (2006.01)

(52) U.S. Cl. .......................... 430/5; 430/394

(58) Field of Classification Search .............. 430/5, 430/394; 716/19, 20, 21; 355/53, 77
See application file for complete search history.

(56) References Cited

U.S. PATENT DOCUMENTS

| | | | |
|---|---|---|---|
| 5,621,216 A | 4/1997 | Clarke et al. | |
| 6,416,952 B1 | 7/2002 | Pirrung et al. | |
| 6,518,180 B1 | 2/2003 | Fukuda | |
| 6,573,014 B2 | 6/2003 | Yamaguchi et al. | |
| 6,894,762 B1 | 5/2005 | Berman et al. | |
| 7,023,530 B1 | 4/2006 | Berman et al. | |
| 7,302,672 B2 | 11/2007 | Pack et al. | |
| 7,345,738 B2 * | 3/2008 | Cummings | 355/53 |

* cited by examiner

*Primary Examiner*—Stephen Rosasco
(74) *Attorney, Agent, or Firm*—McGinn IP Law Group, PLLC; Richard M. Kotulak, Esq.

(57) ABSTRACT

A method of printing multi-layer masks includes analyzing masking requirements of the photomask includes creating pairings of all masking layers requiring substantially similar processing, wherein the pairings include less critical sub-fields that are capable of printing on laser lithography tools, and more critical sub-fields that require e-beam for printing, coating the photomask with a photoresist, exposing the less critical sub-fields and non-critical mask patterns on a laser mask writer where a maximum image size and image placement control are not required, moving the photomask to an e-beam mask writing tool, exposing the more critical sub-fields and patterns that require a maximum image size and placement control with the e-beam mask writing tool, developing the photoresist to reveal latent images that are formed in the e-beam mask writing tool and laser mask writer, transferring pattern of the photoresist to an underlying masking layer using one of direct chemical attack or reactive-ion etching, and removing the photoresist from the photomask.

1 Claim, 3 Drawing Sheets

300

METHOD AND STRUCTURE FOR CREATING A MULTILAYER MASK (MLM OR MLR) USING MULTIPLE WRITE TOOLS TO MINIMIZE MASK WRITE AND SUBSTRATE COSTS

BACKGROUND OF THE INVENTION

1. Field of the Invention

The present invention generally relates to a method and system for making multi layer masks, and more specifically, to a method and system for creating more efficiently utilized multi-layer photomasks, to reduce the total photomask susbstrates required to produce integrated circuits.

2. Description of the Related Art

As semiconductor costs continue to increase, manufacturers are increasingly focused on maskset costs as a venue for cost reduction. Photomasks are templates representing a single layer of a multi-step assembly required for forming integrated circuits. Photomasks are used as projection templates where radiation is passed through a substantially transparent substrate, but in some regions, the radiation is absorbed by a patterned surface film. The pattern of the mask film is then propagated through a lithographic system and reproduced at an imaging plane of the lithographic system.

One of the most attractive methods for reducing maskset costs on low volume designs is through the use of Multi-Layer Reticles (MLR) or Multi-Layer Masks (MLM). These MLMs (or MLRs) include a single photomask substrate that contains a plurality of independent regions, each corresponding to one lithographic layer of integrated circuits. During usage, only one of the independent regions is exposed in the lithographic projection system at a time. Cost reductions are obtained by reducing total number of physical masks required to produce an integrated circuit.

Currently MLM photomasks are made by conventional photomask manufacturing methods, whereby a substrate is coated with a radiation sensitive organic polymer layer (photoresist), and in a direct-write lithographic system, the entire photomask, including multiple independent sub-regions, are patterned as latent images into the photoresist substantially at the same time, by the same photolithographic tool.

Photomasks can be "printed" by a number of different means. The two primary methods are by direct-write from either e-beam or laser tools that reproduce the pattern through physical manipulation of radiation. Laser print tools are generally quicker and require less image size and placement control than e-beam tools. Therefore cost of laser printing photomasks is substantially lower than e-beam printed photomasks.

Because of these limitations, and because a total number of available independent regions does not always correspond to a number of required masking layers, most MLM reticles are not fully spatially utilized, and, therefore, at least one of the potentially useable independent regions is not used for creating the integrated circuit.

SUMMARY OF THE INVENTION

In view of the foregoing and other exemplary problems, drawbacks, and disadvantages of the conventional methods and structures, an exemplary feature of the present invention is to provide a method and structure for creating more efficiently utilized multi-layer photomasks.

A difference between the invention and conventional methods for making multi-layer masks is that the present invention may use a low cost high speed laser writer to print less critical chiplets and structures on a reticle, and applies a high cost and low thruput e-beam writer to print the most critical chips. Therefore, the total number photomask susbstrates required to produce integrated circuits can be reduced while a manufacturing cost of the photomask is optimized.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 1:
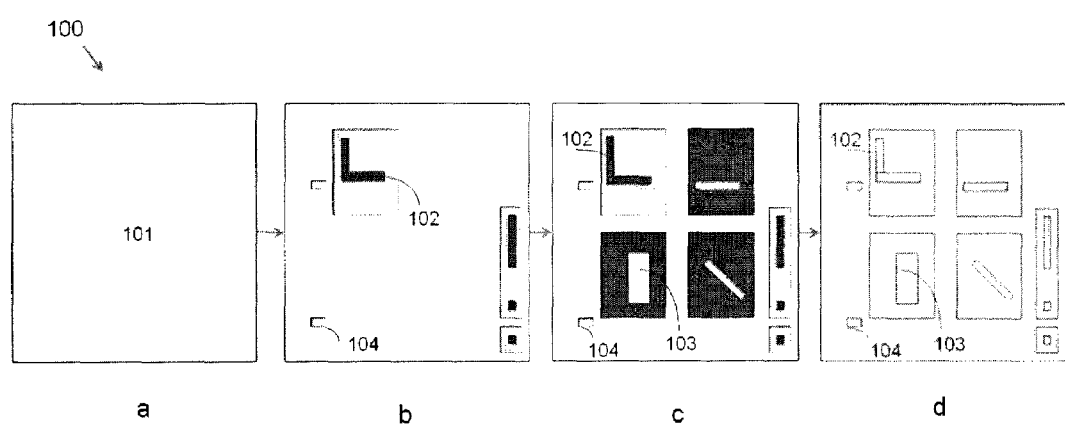
FIG. 1 illustrates exemplary sequential steps in preparing a multi layer mask according to an exemplary aspect of the present invention.

FIG. 1 shows an exemplary embodiment of sequential steps in system 100 for making a multi layer mask.

Starting with a blank quartz photomask 101 at (a), less critical chiplets 102 and barcodes, global alignment marks, and all non-critical fiducial marks 104 are printed by laser exposure at (b).

After printing less critical chiplets, the photomask moves to an e-beam system for exposure of more critical chiplets 103 at (c). Finally, at (d), a photoresist is developed to reveal latent images that are formed in both the e-beam and laser tools, and the photoresist is removed by conventional methods.

Figure 2:
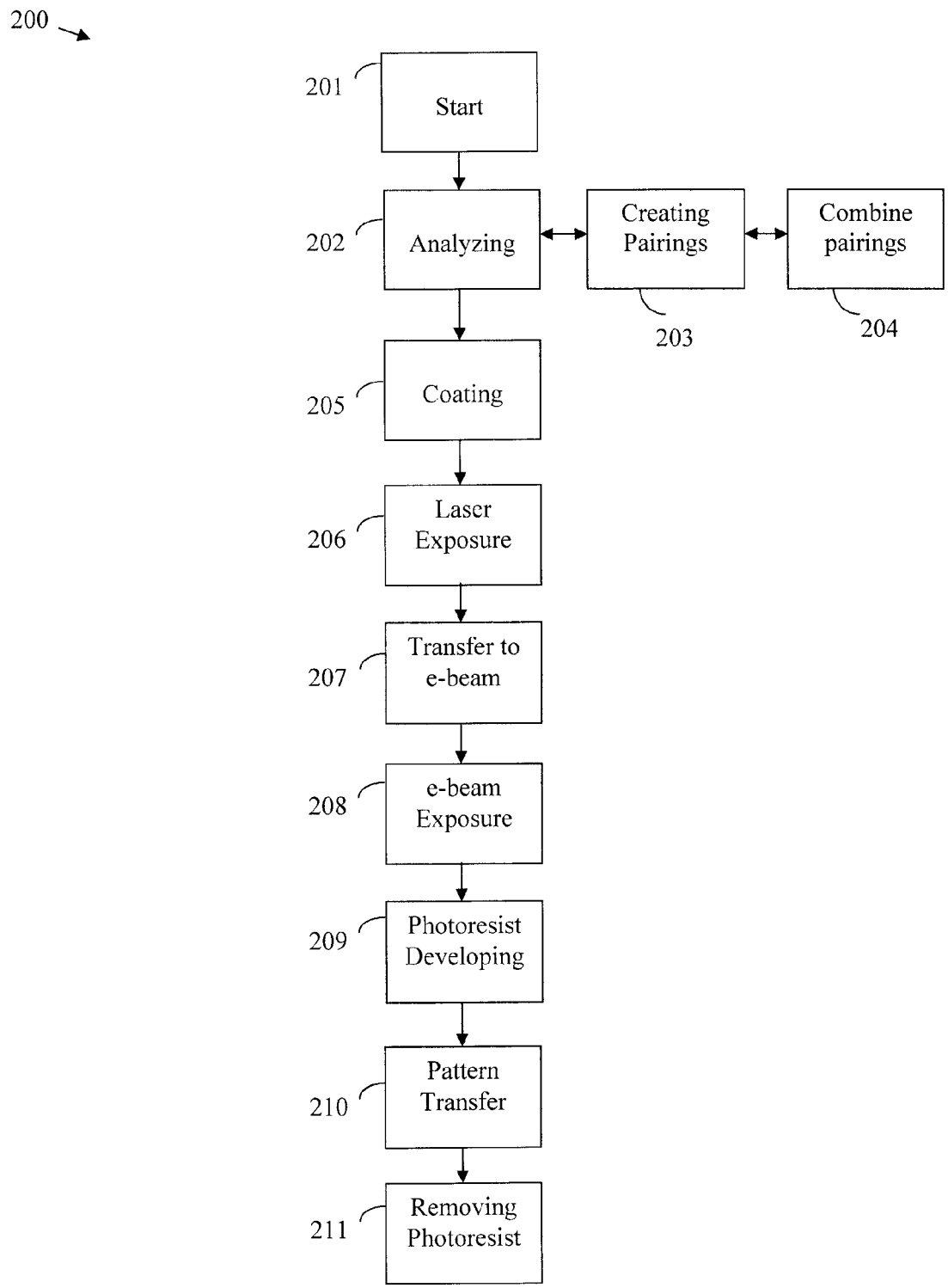
FIG. 2 illustrates a flow chart of an exemplary embodiment of the present invention for making a multi layer mask.
Figure 3:
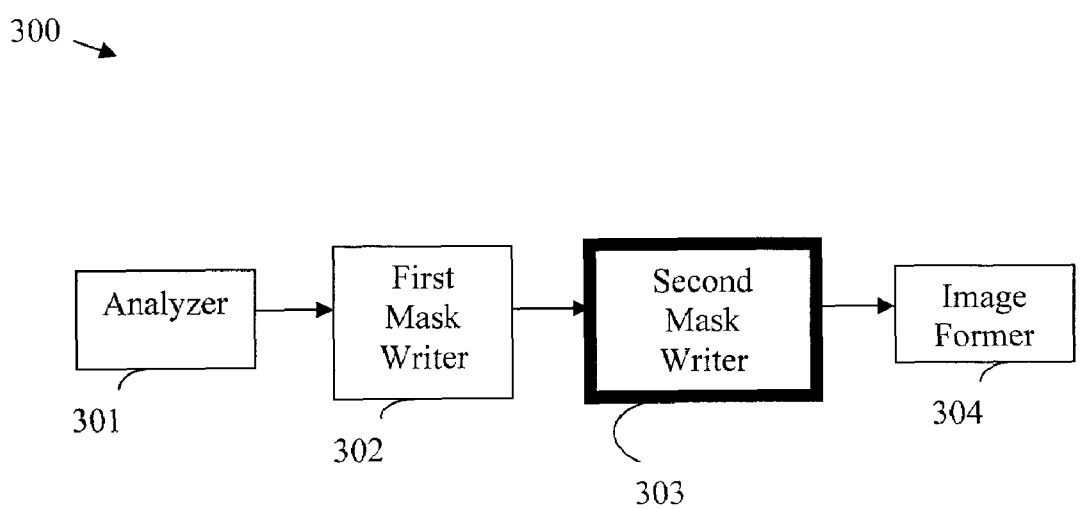
FIG. 3 illustrates exemplary system 300 for creating a multi-layer mask according to an exemplary aspect of the present invention.

FIG. 2 depicts a flow chart 200 for details of sequential steps in FIG. 1 for an exemplary method of making a multi layer mask.

The process starts at step 201 with a blank quartz photomask, coated with masking film, such as chrome, MoSi, carbon, etc. At step 202, masking requirements are analyzed. This includes creating pairings of all masking layers requiring substantially similar processing, at step 203. If the pairings do not total a number divisible by a number of sub-fields required, then the pairings are combined at step 204.

The pairings may include some sub-fields that could be printed on laser lithography tools (e.g., less capable), and some sub-fields that would require e-beam (e.g., more capable, and more expensive).

At step 205, a photoactive polymer (e.g., photoresist) coats the photomask. The sub-fields and non-critical mask patterns (e.g., global alignment marks, barcode, fiducials, etc.) that do not require a maximum image size and placement control, at step 206, are exposed on a laser mask writer.

Then, at step 207, the photomask is moved to an e-beam mask writing tool, and the sub fields and patterns that require a maximum image size and placement control, at step 207, are exposed to an e-beam tool.

At step 209, the photoresist is developed to reveal latent images that are formed in both the e-beam and laser tools.

A pattern of photoresist is transferred, at step 210, to an underlying masking layer using either direct chemical attack or Reactive-Ion Etching (RIE). Finally, at step 211, the photoresist is removed from the photomask.

As a result of this process, an MLM or MLR photomask may be provided with some sub-fields and some mask support structures that are formed using less precise, and less expensive lithography tools, while some other sub-fields and other mask support structures that are formed using a more precise, and more expensive lithography tool.

FIG. 300 shows an exemplary system 300 for creating the MLM. The system includes an analyzer 301 for analyzing masking requirements of a pre-coated quartz photomask, including creating pairings of all masking layers requiring substantially similar processing, a first mask writer 302 for exposing less critical sub-fields and patterns, a second mask writer 303 for exposing more critical sub-fields and patterns, and an image forming device 304 for developing the photoresist and finishing processes.

It should be noted that other objects, features, and aspects of the present invention will become apparent in the entire disclosure. Modifications may be done without departing from the gist and scope of the present invention as disclosed herein and claimed as appended herewith.

In addition, it should be noted that any combination of the disclosed and/or claimed elements, matters and/or items may fall under the modifications aforementioned.

What is claimed is:

1. A method of creating multi-layer masks comprising:
   analyzing masking requirements of a pre-coated quartz photomask, comprising:
   creating pairings of all masking layers requiring substantially similar processing,
   wherein the pairings include less critical sub-fields that are capable of printing on laser lithography tools, and more critical sub-fields that require e-beam for printing,
   wherein said less critical sub-fields comprise chiplets, barcodes, and global alignment marks,
   wherein if the pairings do not total a number divisible by a number of sub-fields required, then the pairings are combined;
   coating the photomask with a photoresist;
   exposing said less critical sub-fields and patterns on a first mask writer where a maximum image size and image placement control are not required,
   wherein said first mask writer comprises a laser projection system;
   moving the photomask from the first mask writer to a second mask writer, located outside said first mask writer,
   wherein said second mask writer comprises an electron beam direct write system;
   exposing said more critical sub-fields and patterns that require a maximum image size and placement control with the second mask writer;
   developing the photoresist to reveal latent images that are formed in said first mask writer and said second mask writer;
   transferring pattern of the photoresist to an underlying masking layer by using one of direct chemical attack or reactive-ion etching; and
   removing the photoresist from the photomask.

* * * * *